United States Patent
Root et al.

(10) Patent No.: US 7,295,961 B2
(45) Date of Patent: Nov. 13, 2007

(54) METHOD FOR GENERATING A CIRCUIT MODEL

(75) Inventors: David E. Root, Santa Rosa, CA (US); Nicholas B. Tuffilaro, San Franscisco, CA (US); John Wood, Santa Rosa, CA (US); Jan Verspecht, Steenhuffel (BE)

(73) Assignee: Agilent Technologies, Inc., Santa Clara, CA (US)

( * ) Notice: Subject to any disclaimer, the term of this patent is extended or adjusted under 35 U.S.C. 154(b) by 777 days.

(21) Appl. No.: 10/712,706

(22) Filed: Nov. 12, 2003

(65) Prior Publication Data

US 2005/0102124 A1 May 12, 2005

(51) Int. Cl.
G06F 17/50 (2006.01)
G06F 17/10 (2006.01)
G01R 13/00 (2006.01)

(52) U.S. Cl. .............................. 703/14; 703/2; 702/66; 702/69; 702/124

(58) Field of Classification Search .................. 703/13, 703/14, 2; 702/66, 69, 124, 189; 704/258; 324/623; 342/193
See application file for complete search history.

(56) References Cited

OTHER PUBLICATIONS

David E. Root, John Wood, and Nick Tufillaro; "New Techniques for Non-Linear Behavioral Modeling of Microwave/RD ICs from Simulation and Nonlinear Microwave Measurements"; Jun. 2003; ACM; Proceedings of the 40th conference on Design Automation; pp. 85-90.*

John Wood and David E. Root; "The Behavioral Modeling of Microwave/RF ICs using Nonlinear Time Series Analysis"; Jun. 2003; IEEE; pp. 791-794.*

David E. Root, John Wood, Nick Tufillaro, Dominque Schreurs, and Alexander Pekker; "Systematic behavioral modeling of nonlinear microwave/RF circuits in the time domain using techniques from nonlinear dynamical systems"; 2002; IEEE; pp. 71-74.*

D. Schreurs, J. Wood, N. Tufillaro, D. Usikov, L. Barford, and D.E. Root; "The Construction and Evaluation of Behavioral Models for Microwave Devices Based on Time-Domain Large-Signal Measurements"; 2000; IEEE; pp. 819-822.*

Jens Verspecht; "Describing Functions Can Better Model Hard Nonlinearities In The Frequency Domain Than The Volterra Theory"; 1995; pp. 1-17.*

(Continued)

*Primary Examiner*—Paul Rodriguez
*Assistant Examiner*—Jason Proctor

(57) ABSTRACT

The present invention includes a method for generating a model of a circuit having an input port and an output port. The method determines an amplitude for current leaving the output port at a frequency $\omega_k$ when a signal that includes a carrier at $\omega_j$ modulated by a signal $V_j(t)$ is input to the input port, wherein $\omega_k$ is a harmonic of $\omega_j$. The determined amplitude is used to determine values for a set of constants, $a^k$, such that a function $f_k(V, a^k)$ provides an estimate of the current, $I_k(t)$, leaving the output port at a frequency $\omega_k$ when a signal having the form $$V(t) = \operatorname{Re} \sum_{k=1,H} V_k(t)\exp(j\omega_k t)$$

is input to the input port. Here $V_k(t)$ is a component of a set of values V. The $f_k(V, a^k)$ are used to provide a simulator component adapted for use in a circuit simulator.

11 Claims, 2 Drawing Sheets

OTHER PUBLICATIONS

O.J. Nastov and J.K. White, "Time-Mapped Harmonic Balance", 1999, ACM, DAC 99, pp. 641-646.*

Traverso, et al—A Nonlinear Dynamic S/H-ADC Device Model Based on a Modified Volterra Series: Identification Procedure and Commercial CAD Tool Implementation—IEEE Transactions on Instrumentation and Measurement, vol. 52, No. 4, pp. 1129-1135, Aug. 2003.

Constantini, et al—Accurate Prediction of PHEMT Intermodulation Distortion Using the Nonlinear Discrete Convolution Model—2002 IEEE MTT-S Digest—p. 857-860.

Mirri, et al—A Modified Volterra Series Approach for the Characterization of Non-Linear Dynamic Systems—IEEE I and M Technology Conference—pp. 710-715—Jun. 4-6, 1996.

Maas—Modeling MESFET's for Intermodulation Analysis of Mixers and Amplifiers—IEEE Transactions on Microwave Theory and Technology, vol. 38, No. 12, pp. 1964-1971, Dec. 1990.

Leke & Kenney—Behavioral Modeling of Narrowband Microwave Power Amplifiers with Applications in Simulating Spectral Regrowth—1996 IEEE MTT-S Digest, p. 1385-1388.

Ku, et al—Extraction of Accurate Behavioral Models for Power Amplifiers with Memory Effects using Two-Tone Measurements—2002 IEEE MTT-S CDROM—pp. 139-142.

Ku & Kenney—Behavioral Modeling of RF Amplifiers Considering IMD and Spectral Regrowth Asymmetries—2003 IEEE MTT-S Digest—pp. 799-802.

J.S. Kenney—Device Level Behavioral Modeling for Microwave Components—2000 IMS Workshop on Nonlinear CAD—pp. 1-39—Jun. 2000.

Ngoya & Larcheveque—Envelop Transient Analysis: A New Method for the Transient and Steady State Analysis of Microwave Communication Circuits and Systems—1996 IEEE MTT-S Digest pp. 1365-1368.

Larcheveque, et al—New and Efficient Method for the Multitone Steady-State Circuit Simulation—1998 IEEE—pp. VI 330-VI 333.

Soury, et al—A New Behavioral Model taking into account Nonlinear Memory Effects and Transient Behaviors in Wideband SSPAs—2002 IEEE MTT-S CD-ROM—pp. 853-856.

Ngoya, et al—Accurate RF and Microwave System Level Modeling of Wide Band Nonlinear Circuits, 2000 IEEE—pp. 1-4.

Soury, et al—Measurement Based Modeling of Power Amplifiers for Reliable Design of Modern Communications Systems—2003 IEEE MTT-S Digest, pp. 795-798.

Harkouss, et al—Modeling Microwave Devices and Circuits for Telecommunications System Design—IEEE 1998—pp. 128-133.

Ngoya—Frequency Domain Methods for Bottom-UP RF and Microwave Nonlinear Subsystem Modeling—MTT-S 2003 Workshop WSG: Fundamentals of Nonlinear Behavioral Modeling—pp. 1-38, Jun. 2003.

Borges and Pedro—A Comprehensive Explanation of Distortion Sideband Asymmetries—IEEE Transactions on Microwave Theory and Techniques, vol. 50, No. 9, Sep. 2002, pp. 2090-2101.

Fager, et al—Intermodulation Distortion Behavior in LDMOS Transistor Amplifiers—2002 IEEE MTT-S CDROM, pp. 131-134.

Pedro, et al—Modeling Nonlinear Behavior of Band-Pass Memoryless and Dynamic Systems—2003 IEEE MTT-S Digest, pp. 2133-2136.

Fager, et al—Prediction of IMD in LDMOS Transistor Amplifiers Using a New Large-Signal Model, IEEE Transactions on Microwave Theory and Techniques, vol. 50, No. 12, Dec. 2002, pp. 2834-2842.

Pedro & Carvalho—Artificial Frequency-Mapping Techniques for Multi-Tone Harmonic Balance—International Microwave symposium 2000—pp. 1-24.

Pedro & Carvalho—Mixed Time and Frequency Domain Behavioral Modeling and Simulation—International Microwave Symposium 2003, workshop on Fundamentals of Nonlinear Behavioral Modeling, pp. 1-38.

* cited by examiner

METHOD FOR GENERATING A CIRCUIT MODEL

FIELD OF THE INVENTION

The present invention relates to computer programs for modeling electronic circuits on a computer.

BACKGROUND OF THE INVENTION

The complexity of modem integrated circuits and the high cost of fabricating prototypes has led to the development of a class of computer programs that simulate the operation of a circuit. These simulators aid the designer in determining the proper bias voltages to be applied to the various components and in verifying the operation of the circuit before resources are committed to the fabrication of prototypes.

The circuit to be simulated is typically described in terms of a list of nodes and the components connected to each node. The user may actually provide a net list or a graphical representation of the circuit from which the program derives the net list. Each component may be viewed as a device that sources or sinks a current whose amplitude and phase are determined by the voltage at the nodes to which it is connected, and possibly, by the previous voltages at the node in question.

The simulation program finds the set of node voltages that lead to a circuit in which the sum of the currents at each node is zero. This is the voltage at which the currents provided by components that are the source of currents is exactly matched by the currents sinked by the remaining components. Each component is described by a subroutine that provides the current sinked or sourced by the component in response to an input voltage. As will be explained in more detail below, the component subroutines may also provide the first derivatives of the current with respect to the node voltages. In addition, the output of a component subroutine may depend on the history of the node to which the corresponding component is connected. For example, if the component contains inductors or capacitors, than the current will depend on the node voltage and the rate of change of the node voltage with time. The rate of change of the node voltage may be computed from the previous values of the node voltages, i.e., the "history of the nodes".

Unfortunately, modem integrated circuits and systems have become too complex to permit complete simulation of the non-linear behavior at the transistor level of description. The number of nonlinear functions that must be solved simultaneously is too large for the simulator to determine a convergent solution in a reasonable time, if at all. This problem presents a significant productivity bottleneck for design engineers. A solution to this problem is to design at a higher level of abstraction, using behavioral models of the nonlinear components or ICs in the circuit or system. In principle, the behavioral models can represent the relevant nonlinear electrical behavior of the components with sufficient accuracy, yet they are simple enough to allow rapid simulation.

The behavioral model is a description of the electrical behavior of the device, circuit, or sub-system that permits the circuit simulation to perform in a manner that represents the actual circuit behavior in a correct manner, in the given simulation conditions. The simulation environment often imposes constraints on what the circuit simulation can predict. For example, a simple linear model of a real nonlinear component will be able to imitate the actual component's behavior in a small-signal simulation, but will be unable to predict the component's behavior under conditions where the drive signal to the component is large enough to excite the nonlinear behavior. Yet the linear model will allow the small-signal simulation to run quickly. The linear model is therefore an accurate description of the component within the limitations of small-signal conditions, and most suitable for such simulations.

Models of nonlinear components such as transistors generally comprise several equations that describe the physics or terminal electrical properties of the transistor. These equations include nonlinear differential equations that account for the reactive elements in the devices or circuits. Historically these equations are written as time-domain equations. The simulators solve the nonlinear equations by iteration at each time-step in the solution, converging to an answer that satisfies the electrical circuit laws, before moving on to the next time step and repeating the solution exercise, as the circuit voltages progress with time. The time-steps must be small enough for the changes in the voltages and currents in the circuit to be small, enabling accurate approximations to the time derivatives to be calculated, for solving the differential equations.

While these time-domain models may be accurate in their descriptions of device behavior, in a circuit they will present the simulator with many nonlinear equations to solve. This can lead to the time-consuming convergence difficulties alluded to earlier, for complex circuits or systems of components. More efficient circuit solution techniques have been developed to deal with specific circuit and system design problems. For example, the time domain solution method can be inefficient for high frequency signals, the time-steps must be a tiny fraction of the signal cycle to permit the simulator to converge. This is particularly true for large-signal analysis where high-order harmonics of the drive signal are created by the nonlinear devices and sub-circuits. The simulator time-step must be a small fraction of the highest frequency component under consideration. This can result in very long simulation times.

An alternative method, called harmonic balance (HB) is often used for simulations of microwave and wireless circuits and systems in the frequency domain. In this method, the voltages and currents in the circuit at each frequency component of the signal are calculated, and solved for each frequency component that is present. This is a truly nonlinear simulator, since the nonlinear devices and components generate harmonic and intermodulation signal components, and the effects of these are solved at each frequency. Since generally the number of frequency components is quite small, this solution method can offer savings in the amount of time needed to solve the nonlinear equations describing the circuit. This method, however, only solves for steady-state conditions and hence periodic or quasi-periodic signals.

Modern communication systems utilize complicated circuits that are stimulated by complex signals. The signals are typically a high frequency 'carrier' signal, which is modulated by a complex information signal. Such signal combinations are difficult to solve using either time-domain or HB techniques alone. The carrier is best suited to HB, and the information signal, or envelope, is amenable to solution in the time domain, since the modulation frequencies are relatively low: the two signal are said to have very different timescales.

A class of simulators known as 'transient envelope' simulators has been developed to solve these problems, essentially by splitting the signal up into carrier and modulation signals, and solving the circuit equations for each appropriately, as indicated above, and coupling the solutions to ensure convergence of the overall solution. For example, U.S. Pat. No. 5,588,142 teaches a simulator for simulating circuits that are stimulated with a signal that is represented as a plurality of carriers that are modulated by slowly varying signals.

Transient envelope simulators assume that a model is available for each circuit component in the circuit being simulated. This will be the true if the circuit component is one of the elementary components, i.e, resistors, capacitors, diodes, etc, in the simulator component library. If the component is constructed from a reasonably small number of elementary components having models in the simulator library, this condition can also be satisfied by replacing the circuit component by a description that defines the circuit component in the elementary components of the library, and then requiring the simulator to simulate both the circuit component in question and the larger circuit in which it performs as if the combination were one large circuit constructed from the library components.

Unfortunately, this solution is not always possible. For a complex circuit, the number of elementary components may be too large to allow the simulator to compute a solution. In this regard, it should be noted that the simulator utilizes an iterative process to simulate the circuit, and hence, the number of simulations of the circuit element needed to use this approach can be prohibitively large if the circuit element contains a large number of components and is to be simulated from "scratch" at each iteration.

In addition, there are cases in which the circuit being simulated is provided as a "black box" from a manufacturer or the elementary components from which the circuit is constructed are being operated in a range for which valid models are not available. In either case, a model for the component that is adapted for use in the circuit simulator must be provided for the user.

SUMMARY OF THE INVENTION

The present invention includes a method for generating a model of a circuit having an input port and an output port. The method determines an amplitude for current leaving the output port at a frequency $\omega_k$ when a signal that includes a carrier at $\omega_j$ modulated by a signal $V_j(t)$ is input to the input port, wherein $\omega_k$ is a harmonic of $\omega_j$. The determined amplitude is used to determine values for a set of constants, $a^k$, such that a function $f_k(V,a^k)$ provides an estimate of the current, $I_k(t)$, leaving the output port at a frequency $\omega_k$ when a signal having the form $$V(t) = \text{Re} \sum_{k=1,H} V_k(t)\exp(j\omega_k t)$$

is input to the input port. Here $V_k(t)$ is a component of a set of values V. The $f_k(V,a^k)$ are used to provide a simulator component adapted for use in a circuit simulator. The simulator component has a first simulator input port and a simulator output port, the component returning a value, $f_k(V,a^k)$, via the simulator output port when the simulator provides values for V at the first simulator input port for at least one value of k. In one embodiment, the amplitude is determined by applying an electrical signal to the circuit and measuring a signal at the output port. In another embodiment, the amplitude is determined on a circuit simulator by simulating an electrical signal is applied to the circuit. The model may be used in a transient envelope simulator. The functions $f_k(V,a^k)$ are evaluated by a neural network that was trained with a training set includes the determined amplitude in another embodiment of the invention. In another embodiment, the functions $f_k(V,a^k)$ include weighted sums of basis functions. In an embodiment in which the functions $f_k(V,a^k)$ further depend on inputs derived from V that are not provided directly by the simulator in which the model is to function, the simulator component further includes a second simulator input port and a computational component having a component input port and a component output port, the component input port is connected to the first simulator input port and/or the simulator output port and the component output is connected to the second simulator input port, the computational component generating the inputs that are derived from V and/or the $I_k(t)$ on the component output port when the input port receives a signal specifying V. The computational component can be implemented as a circuit component from a simulator component library.

DETAILED DESCRIPTION OF THE PREFERRED EMBODIMENTS OF THE INVENTION

The present invention provides a method for defining a model, and extracting parameters used in the model, of a circuit from the outputs of that circuit when the circuit is stimulated with known signals. In general, the test signals extend over a sufficient time period to measure effects at both the long and short time scales associated with the circuit. The model is well adapted for use in a transient envelope simulator in that it accepts as inputs the quantities that are naturally provided by such a simulator. Once the model is completed, the model can be used within the simulator to simulate the circuit under different input signal conditions than those used to build the model. In addition, the transient envelope simulator can simulate larger circuits that include the model as a component thereof.

The present invention can be more easily understood by first reviewing the manner in which a transient envelope simulator operates. A circuit that is to be simulated is described by nodes that connect the various circuit elements. The simulator solves the circuit equations to provide the voltages and currents at each node as a function of time. In a transient envelope simulator, the signals applied to a circuit element at a particular port of that element are described in terms of the generally time-varying complex amplitude of each of a number of harmonics. The circuit element is represented by a subroutine that accepts these amplitudes as inputs and returns the current generated by the circuit element at each of the harmonics in question on each of the ports of the circuit.

Figure 1:
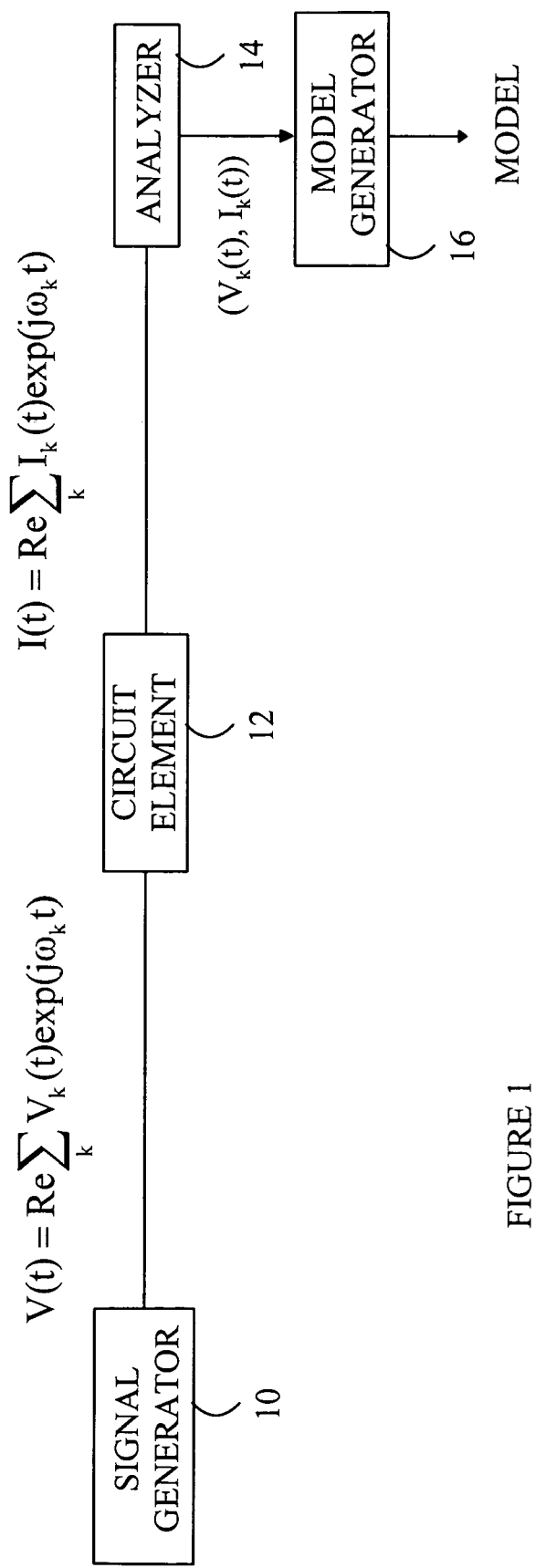
FIG. 1 illustrates the experimental setup used to generate the test data used in one embodiment of the present invention.

A behavioral model according to the present invention is a subroutine that accepts the amplitudes at each of a number of harmonics and generates the currents leaving the circuit at each of these harmonic frequencies on each of the circuits ports. The manner in which the model is built can be more easily understood with reference to a simple circuit having one input port and one output port. The generalization of the method of the present invention to circuits having multiple input and output ports will be discussed in more detail below. Refer now to FIG. 1, which illustrates an experimental setup that can be used to generate the data on which the model is based. The circuit element 12 to be modeled receives a test signal V(t) from a signal generator 10. The output of the circuit, I(t), when the circuit is stimulated by V(t) is recorded by an analyzer 14. It is assumed that V(t) and I(t) can be written in the form:

$$V(t) = \text{Re} \sum_k V_k(t)\exp(j\omega_k t) \quad (1)$$

$$I(t) = \text{Re} \sum_k I_k(t)\exp(j\omega_k t) \quad (2)$$

where $V_k(t)$ and $I_k(t)$ are slowly varying functions of t. In other words, the input and output signals are constructed from slowly modulated carriers.

Given the observed I(t), the slowly varying components $I_k(t)$ can, for example, be obtained by filtering I(t) with narrow band filters centers around $\omega_k$ for each value of k. To simplify the measurement process, in one embodiment of the present invention, a number of simple V(t) signals are used to stimulate the component. Each input has a single carrier that is modulated by slowly varying signal. That is, only one of the $V_k(t)$ functions is different from zero. It should be noted, however, that a single carrier can excite output currents at the input frequency as well as frequencies that are different from that frequency. Hence, the $I_k(t)$ functions must be obtained for each harmonic even when the input has only one harmonic.

Given the observed values for $I_k(t)$ and the known $V_k(t)$, the model generator 16 constructs a model that is suitable for use in a circuit envelop simulator. That is, given a new input signal characterized by modulation amplitudes, $V'_k(t)$, the model will provide an approximation to the amplitudes, $I'_k(t)$, of the output signal that would be generated with this new input at each harmonic. It should be noted that the carrier frequencies associated with the new input and output signals may be different from those used to analyze the circuit component.

Since such simulators are known to the art, they will not be discussed in detail here. The reader is referred to U.S. Pat. No. 5,588,142, which is hereby incorporated by reference, for a detailed description of such a simulator. For the purposes of the present discussion, it is sufficient to note that a circuit envelop simulator is provided with code that describes the behavior of each circuit component that is connected to each of the nodes in the circuit being simulated. The code describing the circuit elements must provide the contribution, $I_k(t)$, of that circuit element at each of the carrier frequencies in the output signal from data provided by the simulator that specifies $V_j(t)$ at the input to the element for j, k=1 to H. Here, H is the number of harmonics in the input and output signals. In the general case, $I_k(t)$ may also depend on values other than the current $V_j(t)$ values such as previously calculated values of the $I_j(t)$ or previous values of $V_j(t)$. That is, the model may utilize values $I_j(t-d)$ or $V_j(t-d)$ when computing $I_j(t)$ from $V_j(t)$. For example, $I_k(t)$ may depend on the first time derivative of $V_j(t)$, which, in turn, is computed from previously received values of $V_j(t)$. Similarly, $I_k(t)$ may depend on previously calculated values of the $I_j(t)$ or the derivatives thereof, including higher order time derivatives. The manner in which the present invention provides these other signal values will be discussed in more detail below.

Accordingly, the present invention provides the functions $I_k(t)$ in a form that is consistent with that required by the circuit envelope simulator. That is, a model according to one embodiment of the present invention receives as inputs the $V_j(t)$ for j=1 to H on an input port. The present invention then uses these inputs to provide $I_j(t)$, for j=1 to H, as outputs.

The present invention constructs the model in question by specifying an explicit or implicit functional relationship for each $I_k(t)$ that includes a number of constants that are determined from the observed values of $I_j(t)$ and $V_j(t)$ obtained from the test data, and various other parameters such as the derivatives mentioned above each of the harmonics. To simplify the following discussion, each parameter on which $I_k(t)$ can depend will be denoted by the component of a set or vector x. For example, the first H components of x can be the values of $V_j(t)$ for j=1 to H, the next H components of x could be the first derivatives with respect to time of the $V_j(t)$, and so on. In this notation, $I_k(t)=f_k(x,a^k)$ where $a^k$ is a set of constants that are determined from the experimentally observed values $I_j(t)$ and $V_j(t)$ in the testing phase discussed above. It should be noted that $f_k(x,a^k)$ is a complex-valued function. Denote the number of components in the vectors $a^k$, by M.

For a given value of t, the measured values of $I_k(t)$ and the other parameters in x provide one "training sample". That is, the measurements at time each time provide a training point consisting linking one value of x to one set of $I_k$ values associated with that value of x. Each test signal provides a number of such of such training points. In addition, additional test signals can be utilized to increase the number of training points.

In one embodiment of the present invention, the set of training points is used to train a neural network. Since neural networks are known to the art, they will not be discussed in detail here. For the purposes of the present discussion, it is sufficient to note that the training process defines values for a number of weight parameters within the neural network. These parameters are examples of the vector $a^k$ discussed above. Once the neural network has been trained, it can be tested with additional training points to verify that the neural network is providing the correct $I_k$ values for each input vector x.

In another embodiment of the present invention, a generalized function is used for the $f_k(x, a^k)$. There are many general functions that can be written in terms of such constant vectors and, hence, can be used to model the functions $f_k(x, a^k)$. For example, $f_k(x,a^k)$ can be written as an expansion in an orthonomal basis of the form $$f_k(x, a^k) = \sum_{i=1}^{M} a_i^k B_i(x) \quad (3)$$

Here, the functions, $B_i(x)$, are the orthonormal basis functions. The parameter, $a_i^k$, is the $i^{th}$ component of the vector $a^k$ and is determined from the measured values for $I_k(t)$ by fitting the observed set of values from the testing phase to the function shown in Eq. (3). Any one of a number of basis function sets can be utilized for the expansion shown in Eq. (3). Furthermore, different basis functions can be utilized for different values of k. Since such data fitting procedures are known to the art, they will not be discussed in detail here.

The above-described embodiments of the present invention assume that the parameters on which the $I_k(t)$ depend are known. That is, the parameters to be included in the vector x are known. If some knowledge of the circuit elements that makeup the component being modeled is known, methods for predicting which parameters to include are known to the art.

If such knowledge is not available, the parameters to include in addition to the $V_k(t)$ can be determined experimentally by using an over inclusive set of parameters and observing the quality of the model in predicting the $I_k(t)$ when new test signals are applied. If a satisfactory fit is obtained, the list of parameters can be selectively reduced and the process repeated to determine which parameters are not really needed. If a satisfactory fit is not obtained, additional parameters can be added or a different basis utilized.

As noted above, transient envelope simulators normally provide the $V_k$ values to the model at each time point being processed by the simulator. However, the list of potential parameters for x includes many additional parameters. For example, the time derivatives of $V_k(t)$ may also be required. That is, $f_k(x,a^k)$ can be written in the form $f_k(V,y,a^k)$, where y is a set of inputs that are not directly provided by the simulator. In these cases, a method for obtaining the parameters that are not provided directly by the simulator must be included. The input variables that are not directly provided by the simulator will be referred to as the "calculated inputs" in the following discussion. The inputs variables that are directly provided by the simulator will be referred to as the "provided inputs". Providing additional routines that generate the calculated inputs from the $V_k$ can provide the calculated inputs within the model.

Alternatively, the model elementary component routines included in the simulator's library to perform the computations. In one embodiment of the present invention, these calculated inputs are provided by adding circuit components that convert the provided inputs to the calculated inputs. The calculated inputs are then provided to the model through one or more internal ports. The set of functions $f_k(x, a^k)$ discussed above will be referred to as the core model.

Figure 2:
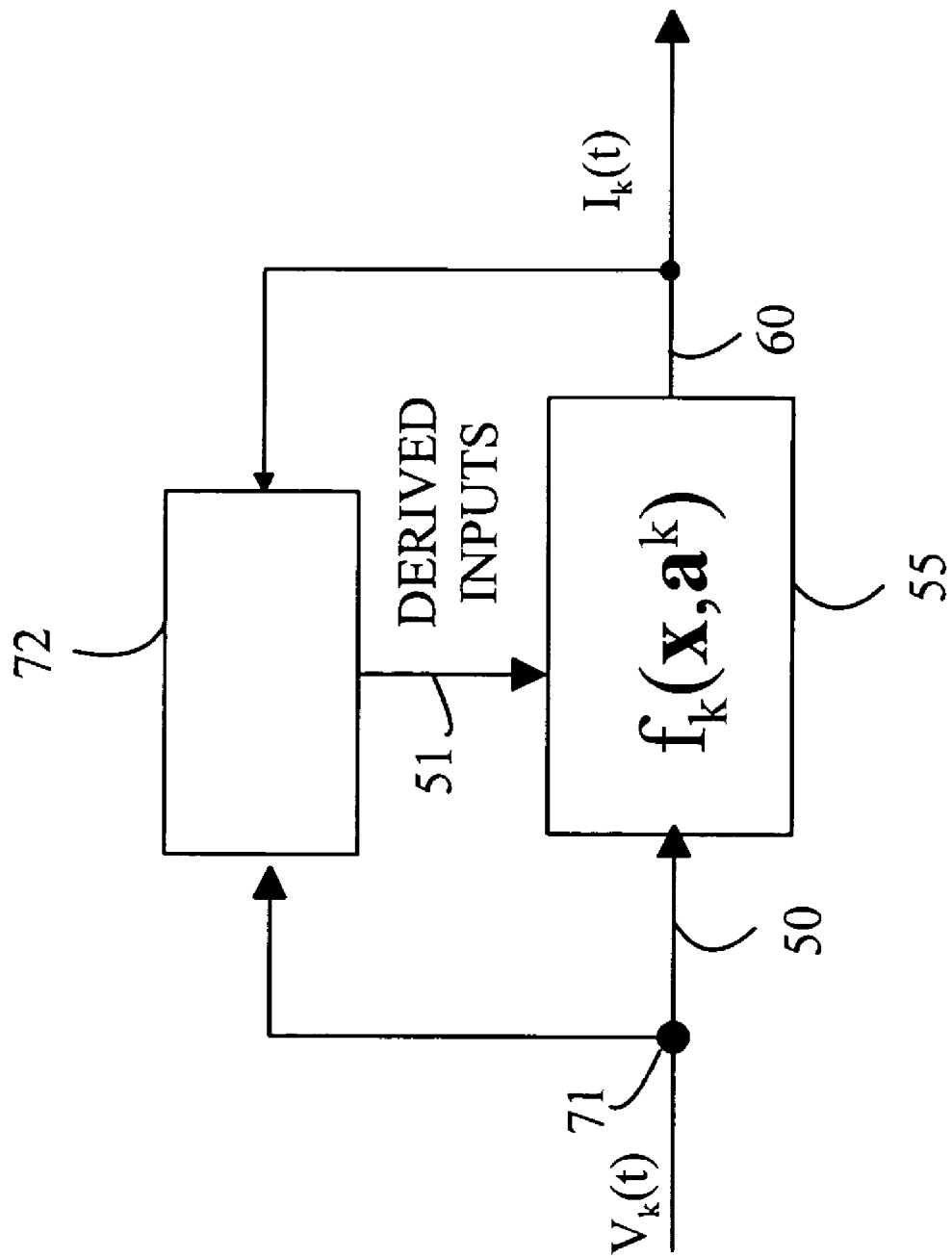
FIG. 2 illustrates a model is augmented to provide calculated inputs.

Refer now to FIG. 2, which illustrates the manner in which the core model is augmented to provide the calculated inputs. For the purposes of this example, assume that the calculated inputs consist of the time derivatives of the $V_k$ or and or the $I_k$. The core model 55 is defined to have two input ports shown at 50 and 51 and one output port 60. The input vector x is divided into the provided inputs and the calculated inputs. The provided inputs are sent to the core model through port 50. Port 50 is also connected at node 71 to a circuit element 72 that converts one or more of the provided inputs to one or more of the calculated inputs which are received by the core model on port 51. For example, in the case in which the calculated inputs are the time derivatives of the $V_k(t)$, circuit element 72 could be a capacitor in series with port 51. Similarly, circuit element 72 can include an inductor for generating the time derivatives of the $I_k(t)$ leaving the output port. Since capacitors are known to differentiate a signal, the outputs of the capacitor at the various harmonics are the needed time derivatives.

In this example, the simulator simulates an augmented circuit with the augmenting elements being elements that are defined in the simulator's library. Similarly, delay elements can be utilized to provide previous values of both the $V_k$ dependent quantities and $I_k$ values and their derivatives for previous time points. If some specific function is needed that is not readily computed using the elementary functions in the simulator's library, a model for that function can be generated and placed in the library.

The analyzer shown in FIG. 1 can, in principle, generate the model of the component. However, given the computational complexity of the fitting process, the data collected by the analyzer will normally be transported to a general-purpose data processing system to fit the data.

The above-described embodiments have utilized experimental measurements of the properties of the circuit that is to be modeled. However, if the circuit in question consists of known components having models in a circuit simulator, the measurement process can be simulated to provide the data on which the model is based. Such simulations are particularly useful for generating a more computational efficient model for the circuit when the circuit is used as an element in more complicated circuits. Once the parameters that define the present invention have been computed, the time needed for the present invention to provide an output from a specified input signal can be a much faster that the time needed for a simulator to solve the problem starting from "scratch". Hence, subsequent simulations can be computationally much more efficient.

In addition, the present invention provides a convenient method for providing a model of a circuit without disclosing the details of the circuit. This feature provides a means for a manufacturer to protect trade secrets while still being able to sell packaged components containing the circuit. In this case, the manufacturer need only provide the model parameters and the basis functions or neural network that is used in the model to the user. The user can then simulate circuits that incorporate the packaged component on a transient envelope simulator to perfect the designs of those circuits. Since the circuit design is not easily inferred from the model, the distributed model does not compromise the manufacturer's proprietary design.

The above-described embodiments of the present invention have been explained in terms of a simple circuit having a single input port and a single output port; however, the present invention can be applied to circuits having multiple input and output ports. In this case, the $I_k(t)$ and $V_k(t)$ functions described above are replaced by $V_k^p(t)$ and $I_k^p(t)$ where p is the port number. A function $f_k^p(x, a)$ is then derived for each output port in a manner analogous to that described above. In such cases, the vector x will, in general, include $V_k^p(t)$ and $I_k^p(t)$ terms for all the ports.

The above description has referred to input signals that are voltages and output signals that are currents. While this is a common formulation of the simulation problem, it should be noted that the inputs can be currents, voltages, or mixtures of currents and voltages that are different for the various ports. Similarly, a given port may have an output signal and an input signal. Hence, the terms input and output signal are not limited to voltages and currents respectively.

Having provided a number of simplified examples of the method of the present invention, a more general description of the method will now be given. Consider a device that is to be simulated. It will be assumed that the device has a number of ports on which it can receive stimuli and provide output signals. The first step in the modeling process is to use either physical equipment such as signal generators and analyzers or a simulation environment to measure the response of the device when a set of signals is applied to one or more ports of the device. These signals could be a single frequency carrier with analogue or digital modulation, or multi-tone carriers including a plurality of sinusoids. In practice, the actual signals are likely to be the 'incident' and 'reflected' power waves, measured by the RF/microwave test equipment. The power waves are transformed linearly to port voltages and currents. If the "measurements" are performed in a simulator, the voltages and current can be provided directly by the simulator.

For the purposes of analyzing the signals, the stimulus is defined to be the voltage at each port, and the response is defined to be the current. The stimulus and response may include signals at the original stimulation frequencies as well as harmonic and intermodulation components of these frequencies. The measured signal amplitudes are expressed as functions that vary in time, i.e., the $V_k^p(t)$ and $I_k^k(t)$ described above. Here, p is the port number, and k identifies the harmonic at which the amplitude is measured.

Next, a core model that depends on the observed quantities and a number of constants that are determined from the measured data is defined. For example, each $I_k^p$ can be a function of one or more of the $V_j^p(t)$ where p can take on any port value and j can take one any of the harmonic values.

In addition, each $I_k^p$ can be a function of the first and higher order time derivatives of the $I_k^p$ where p and k can take on any of the values for which these quantities are defined. It should be noted that other transforms of the input or output variables, such as time delays can be used instead of the derivatives.

The required inputs are then separated into provided inputs and calculated inputs as described above. One or more additional ports are provided for receiving the calculated inputs. Circuit elements that convert the provided inputs to the calculated inputs are then added between the original input port on which the provided inputs were received and the additional ports. This augmentation of the core model then forms the model given to the transient envelope simulator.

Various modifications to the present invention will become apparent to those skilled in the art from the foregoing description and accompanying drawings. Accordingly, the present invention is to be limited solely by the scope of the following claims.

What is claimed is:

1. A method for operating a computer to generate a simulator component that models a first circuit having an input port and an output port in a circuit simulator, said circuit simulator providing a simulated signal comprising a modulated carrier to said simulator component and generating an output indicative of the behavior of a second circuit that contains said first circuit when such a modulated carrier is input to said input port, said method comprising:

determining an amplitude for a current leaving said output port of said first circuit at a frequency $\omega_k$ when a signal comprising a carrier at $\omega_j$ modulated by a signal $V_j(t)$ is input to said input port, wherein $\omega_k$ is a harmonic of $\omega_j$; and using said determined amplitude to determine values for a set of constants, $a^k$, such that a function $f_k(V,a^k)$ provides an estimate of the current, $I_k(t)$, leaving said output port at a frequency $\omega_k$ when a signal having the form $$V(t) = \operatorname{Re} \sum_{k=1,H} V_k(t) \exp(j\omega_k t)$$

is input to said input port of said first circuit by said circuit simulator, where $V_k(t)$ is a component of a set of values V, wherein H is an integer greater than 0; and wherein said simulator component has a first simulator input port and a simulator output port, said simulator component returning a signal value determined by said $f_k(V,a^k)$, via said simulator output port to said circuit simulator when said circuit simulator provides values for V at said first simulator input port for at least one value of k.

2. The method of claim 1 wherein said simulator component also return a value equal to $f_k(V,a^k)$ via said simulator output port when said circuit simulator provides values for V at said first simulator input port for at least two values of k.

3. The method of claim 1 wherein said amplitude is determined by applying an electrical signal to said circuit and measuring a signal at said output port.

4. The method of claim 1 wherein said amplitude is determined on a circuit simulator by simulating an electrical signal being applied to said circuit.

5. The method of claim 1 wherein said circuit simulator is a transient envelope simulator.

6. The method of claim 1 wherein said set of constants, $a^k$, is determined by a neural network that was trained with a training set comprising said determined amplitude.

7. The method of claim 6 wherein $f_k(V,a^k)$ comprises a weighted sum of basis functions.

8. The method of claim 1 wherein $f_k(V,a^k)$ further depends on an input derived from V and wherein said simulator component further comprises a second simulator input port and a computational component having a component input port and a component output port, said component input port being connected to said first simulator input port and said component output port being connected to said second simulator input port, said computational component generating said input derived from V on said component output port when said second simulator input port receives a signal specifying V.

9. The method of claim 8 wherein said input generated by said computational component further depends on the time derivative of $I_k(t)$ for at least one value of k.

10. The method of claim 8 wherein said computational component comprises a circuit component that is provided in a simulator component library.

11. A method for operating a computer to generate a simulator component that models a first circuit having an input port and P output ports in a circuit simulator, said circuit simulator providing a signal comprising a modulated carrier to said simulator component, where P>1, said method comprising:

determining an amplitude for a current leaving each output port of said first circuit at a frequency $\omega_k$ when a signal comprising a carrier at $\omega_j$ modulated by a signal $V_j(t)$ is input to said input port, wherein $\omega_k$ is a harmonic of $\omega_j$; and using said determined amplitude to determine values for a set of constants, $^Pa^k$, such that a function $f^P_k(V,a^k)$ provides an estimate of the current, $I^P_k(t)$, leaving said $P^{th}$ output port at a frequency $\omega_k$ when a signal having the form $$V(t) = \text{Re} \sum_{k=1,H} V_k(t)\exp(j\omega_k t)$$

is input to said input port of said first circuit, where $V_k(t)$ is a component of the set of values V; wherein H is an integer greater than 0; and wherein said simulator component has a first simulator input port and P simulator output ports, said simulator component returning a value determined by $f^p_k(V,a^k)$, via said $p^{th}$ simulator output port when said circuit simulator provides values for V at said first simulator input port for at least one value of k and p, said simulator component allowing said circuit simulator to provide an output indicative of the behavior of a second circuit containing said first circuit.

* * * * *